(12) United States Patent
Suzuki

(10) Patent No.: US 6,747,457 B2
(45) Date of Patent: Jun. 8, 2004

(54) APPARATUS FOR AND METHOD OF CALCULATING OUTPUT DETERIORATION IN SECONDARY BATTERY

(75) Inventor: Kouhei Suzuki, Tokyo (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 10/212,235

(22) Filed: Aug. 6, 2002

(65) Prior Publication Data

US 2003/0030414 A1 Feb. 13, 2003

(30) Foreign Application Priority Data

Aug. 8, 2001 (JP) ........................................ 2001-241250

(51) Int. Cl.⁷ ............................................ G01N 27/416
(52) U.S. Cl. ...................................................... 324/433
(58) Field of Search ................................. 324/426–433; 320/132; 340/636.15, 636.18

(56) References Cited

U.S. PATENT DOCUMENTS 5,122,751 A * 6/1992 Aita et al. ................... 324/433

FOREIGN PATENT DOCUMENTS

JP 2000-261901 9/2000

* cited by examiner

Primary Examiner—Pia Tibbits
(74) Attorney, Agent, or Firm—McDermott, Will & Emery

(57) ABSTRACT

In a secondary battery output deterioration calculating apparatus that calculates a battery output deterioration in conformance to the output ratio of the battery output ascertained as a secondary battery becomes depleted and an initial battery output, the extent of depletion of the secondary battery is calculated through an arithmetic operation by calculating an output ratio based upon the open circuit voltage of the secondary battery and the voltage manifesting while the secondary battery is charged with a constant current.

8 Claims, 8 Drawing Sheets

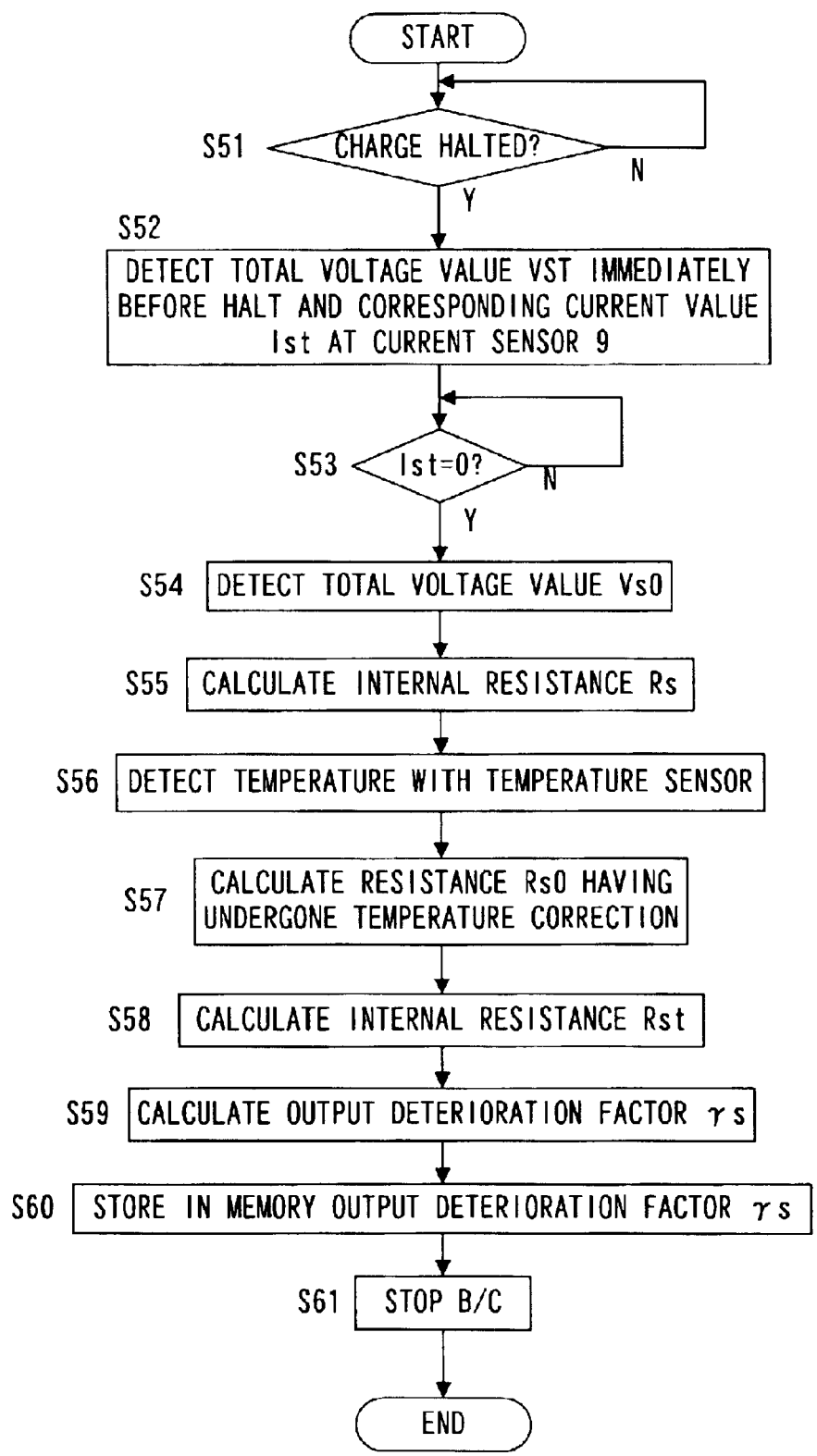

APPARATUS FOR AND METHOD OF CALCULATING OUTPUT DETERIORATION IN SECONDARY BATTERY

BACKGROUND OF THE INVENTION

1. Field of Invention

The present invention relates to an output deterioration calculating apparatus and an output deterioration calculating method adopted to calculate an output deterioration in a secondary battery capable of performing charge/discharge.

2. Description of the Related Art

Methods adopted to calculate output deterioration occurring in a secondary battery mounted in an electric car which may be a hybrid electric car in the related art include the method disclosed in Japanese Laid-Open Patent Publication No. 2000-261901. In this method in the related art, the current and the voltage are detected while driving the motor with the power stored in the secondary battery, i.e., during a discharge operation at the secondary battery, and a regression line representing the discharge characteristics of the battery is obtained by sampling the voltage value and the current value at a plurality of sampling points. The deterioration factor of the secondary battery is ascertained by calculating the internal resistance in the secondary battery manifesting as the battery deterioration is calculated through the arithmetic operation and then calculating the ratio of this internal resistance to the initial internal resistance based upon the regression line thus obtained.

SUMMARY OF THE INVENTION

However, the secondary battery output deterioration calculating method in the related art poses a risk in that the detection may be executed at sampling points at which the error attributable to the current sensor to detect the current level and the error attributable to the voltage sensor employed for detecting the voltage level are superimposed on each other. This naturally leads to a risk in that the regression line may contain an error since the regression line is obtained by sampling the voltage value and the current value at a plurality of error-containing sampling points. As the internal resistance value calculated from the regression line is different from the value of the actual internal resistance when this happens, a problem arises in that the deterioration factor cannot be accurately determined.

An object of the present invention is to provide a secondary battery output deterioration calculating apparatus and a secondary battery output deterioration calculating method that enable accurate calculation of the deterioration in the output of the secondary battery.

The secondary battery output deterioration calculating method according to the present invention adopted to calculate the battery output deterioration based upon the output ratio of the battery output measured as the secondary battery becomes depleted and the initial battery output comprises detecting an open circuit voltage of the secondary battery, detecting the voltage level as the secondary battery is charged with a constant current and calculating the output ratio in correspondence to the open circuit voltage of the secondary battery having been detected and the voltage detected as the secondary battery is charged with the constant current.

In the secondary battery output deterioration calculating apparatus according to the present invention that calculates the battery output deterioration based upon an output ratio of the battery output measured as the secondary battery becomes depleted and the initial battery output, the output ratio is calculated in correspondence to the open circuit voltage of the secondary battery and a voltage detected as the secondary battery is charged with a constant current.

BRIEF DESCRIPTION OF THE DRAWINGS

FIG. 10 presents a flowchart of the control procedure implemented to calculate the output deterioration factor when the charge operation is stopped before shifting to the multistage constant current charge.

DETAILED DESCRIPTION OF THE PREFERRED EMBODIMENT

Figure 1:
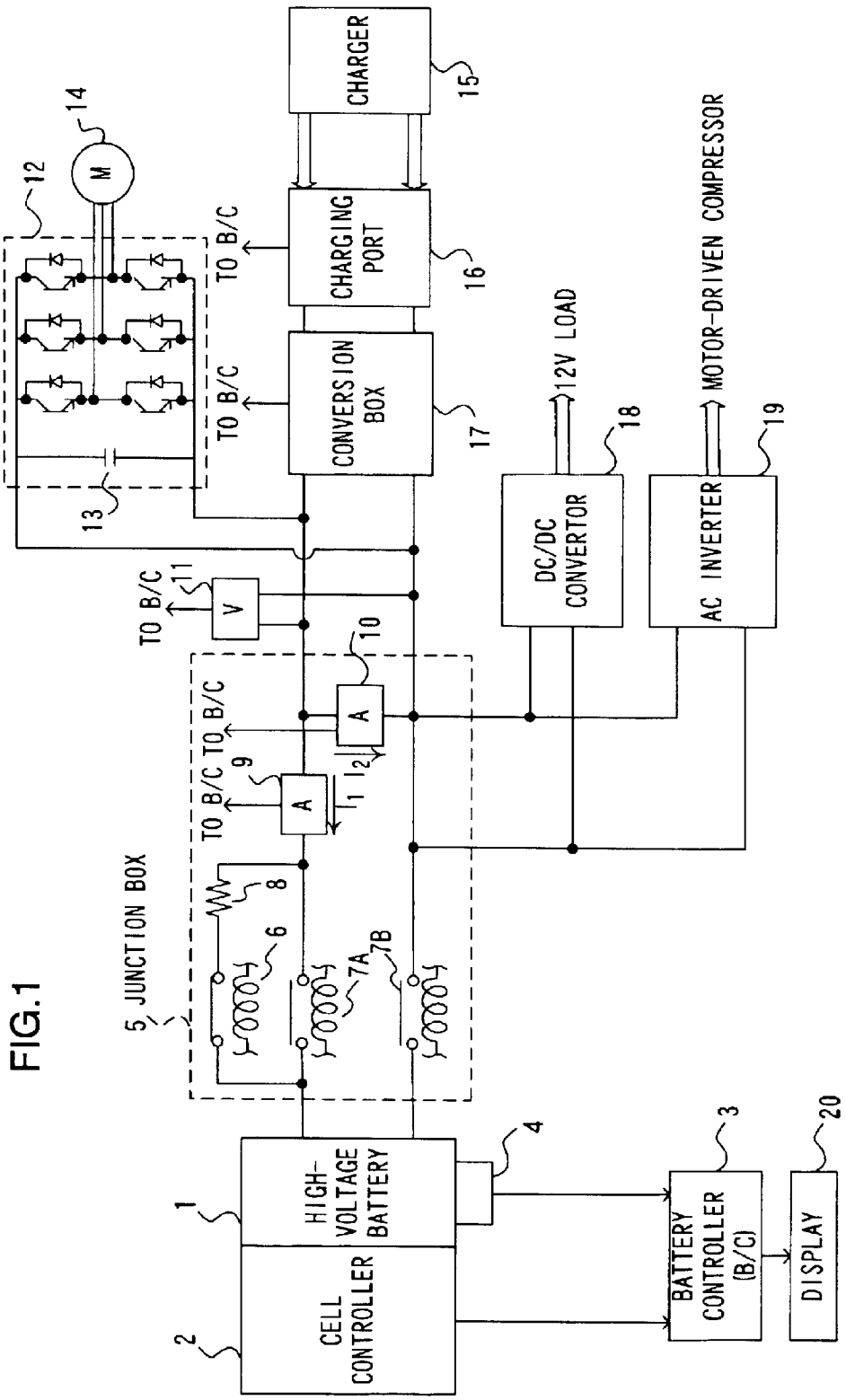
FIG. 1 shows the structure adopted in an embodiment achieved by adopting the secondary battery output deterioration calculating apparatus according to the present invention in an electric car.
Figure 2:
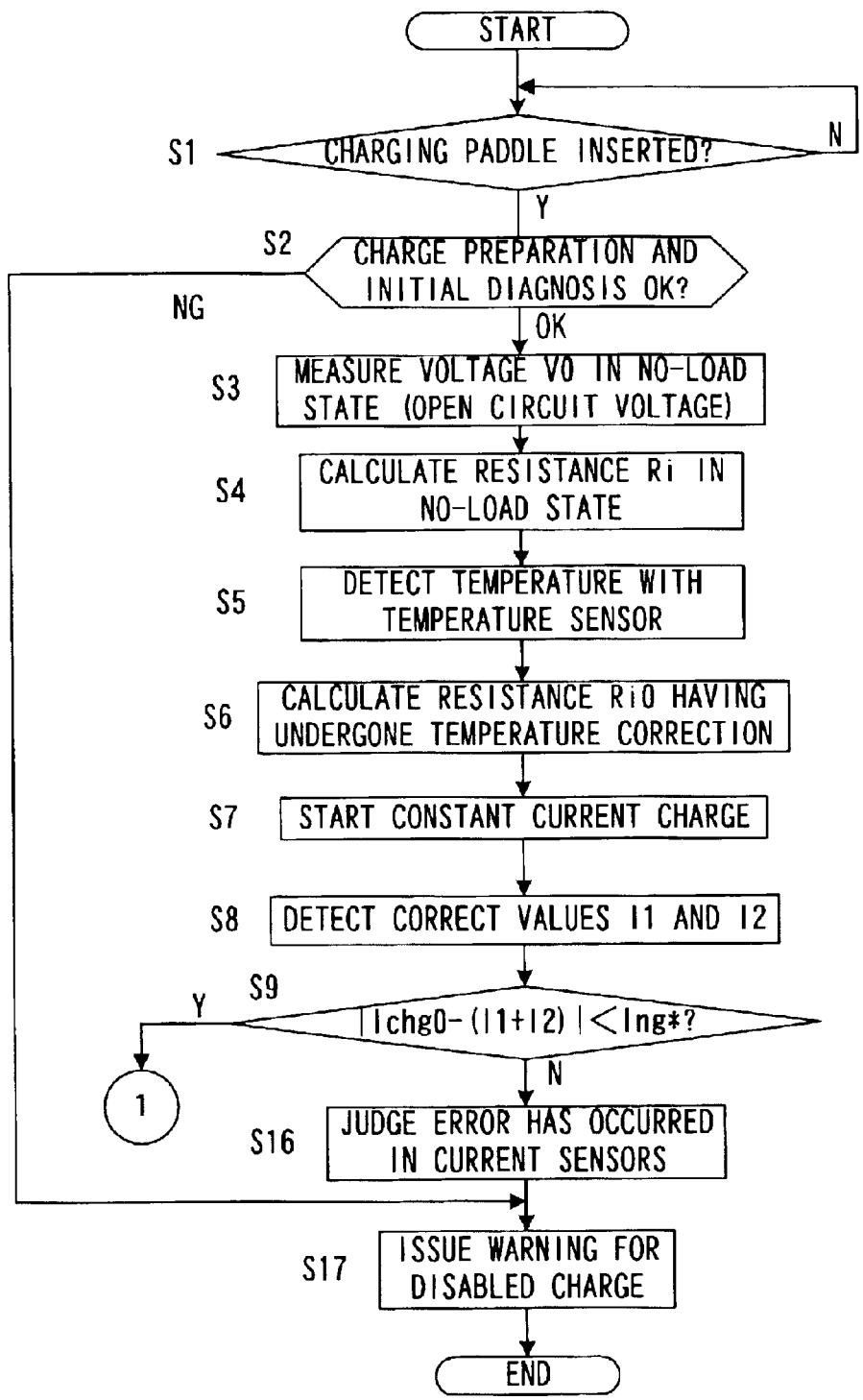
FIG. 2 presents a flowchart of the control procedure implemented in the embodiment of the secondary battery output deterioration calculating apparatus according to the present invention.

FIG. 1 presents a system block diagram illustrating the structure assumed in an embodiment which is achieved by adopting the secondary battery output deterioration calculating apparatus according to the present invention in an electric car. A high-voltage battery 1 is a battery pack constituted by connecting in series four modules each achieved by connecting eight cylindrical cells. The voltage of the battery pack in the embodiment is 120V. A cell controller 2 detects the voltages of the individual cells constituting the battery pack (the high-voltage battery 1) and transmits the results of the detection to a battery controller 3 which is to be described later. A temperature sensor 4 detects the temperature of the high-voltage battery 1. The temperature of the high-voltage battery 1 that has been detected is transmitted to the battery controller 3.

The battery controller (B/C) 3 controls the high-voltage battery 1 based upon various types of data input from different devices. A display 20, which is connected to the battery controller 3, displays the vehicle running state, the charge state of the high-voltage battery 1 and the like.

Inside a junction box 5, a charge resistor relay 6, main relays 7A and 7B, a charge resistor 8 and current sensors 9 and 10 are provided. The main relays 7A and 7B supply/cut off the power (current) provided from the high-voltage battery 1 to/from other voltage systems. The charge resistor relay 6 prevents an excess current from the high-voltage battery 1 from flowing to a smoothing capacitor 13 which may be provided, for instance, inside an inverter 12 immediately after the ignition key (not shown) is turned on. In other words, immediately after the ignition key is turned on, the current is allowed to flow via the charge resistor 8 by turning on (connecting) the charge resistor relay 6 to prevent any excess current from flowing to the smoothing capacitor 13. When the smoothing capacitor 13 is charged, the charge resistor relay 6 is cut off and the main relays 7A and 7B are turned on.

The current sensor 9 detects a current I1 flowing between the high-voltage battery 1 and, for instance, the inverter 12. The current sensor 10 detects a current I2 flowing from the high-voltage battery 1 to a DC/DC converter 18 or the like to be detailed later. A voltage sensor 11 detects the voltage at the path extending from the high-voltage battery 1 to the inverter 12 or the like. The values of currents I1 and I2 detected by the two current sensors 9 and 10 and the value of the voltage detected by the voltage sensor 11 are individually provided to the battery controller 3.

The inverter 12 converts the DC voltage supplied from the high-voltage battery 1 to a desired 3-phase AC voltage and is controlled by a motor controller (not shown). A motor 14 drives the electric car and also generates power by engaging in a regenerative operation as the electric car decelerates. The inverter 12 converts the 3-phase AC voltage to a DC voltage so as to charge the high-voltage battery 1 with the regenerated power supplied from the motor 14.

A charger 15, which charges the high-voltage battery 1 mounted on the electric car, is provided outside the electric car. High-frequency AC power supplied from the charger 15 is provided to a conversion box 17 via a charging port 16. The charging port 16 includes an optical communication unit which is engaged in the control of communication with the charger 15, a semi-fit switch that detects the state of the insertion of a charging paddle (not shown) of the charger and a full-fit switch that detects that the charging paddle is fully fitted at the charging port 16. The conversion box 17 converts the high-frequency AC power supplied from the charger 15 via the charging port 16 to DC power.

The DC/DC converter converts the high voltage (120V) supplied from the high-voltage battery 1 to a 12V voltage and supplies the voltage resulting from the conversion to a 12V battery or a 12V load. An AC inverter 19 converts the DC voltage to an AC voltage in order to supply power to an inverter unit (not shown) that drives a motor-driven compressor (not shown) of an air-conditioning system installed in the electric car.

FIGS. 2~5 present a flowchart of the processing procedure adopted in the output deterioration calculation executed in the secondary battery output deterioration calculating apparatus in the embodiment. The processing which starts in step S1 is mainly executed by the battery controller 3. The processing is explained in sequence starting with step S1 below.

In step S1, it is judged that the charging paddle (not shown) has been fully inserted at the charging port if the full-fit switch (not shown) is on and the semi-fit switch (not shown) is off, and the operation then proceeds to step S2. In step S2, a preliminary operation for a charge is performed and also an initial diagnosis is executed. In the initial diagnosis, a diagnosis is made with regard to the temperature and the open circuit voltage at the high-voltage battery 1. Namely, the temperature of the high-voltage battery 1 is detected by the temperature sensor 4 and also the open circuit voltage of the high-voltage battery 1 is detected, and then a judgement is made as to whether or not both values fall within predetermined ranges. If it is judged that both values fall within the predetermined ranges, the operation proceeds to step S3, whereas if it is judged that either value is outside the corresponding predetermined range, the operation proceeds to step S17.

In step S3, the open circuit voltage V0 in no-load state is detected. Once the open circuit voltage V0 is detected, the operation proceeds to step S4. In step S4, an internal resistance Ri at the high-voltage battery 1 is calculated based upon the open circuit voltage V0 detected in step S3. Now, a method that may be adopted to calculate the internal resistance Ri is explained in reference to the curves representing secondary battery voltage-internal resistance characteristics presented in FIG. 6.

Figure 6:
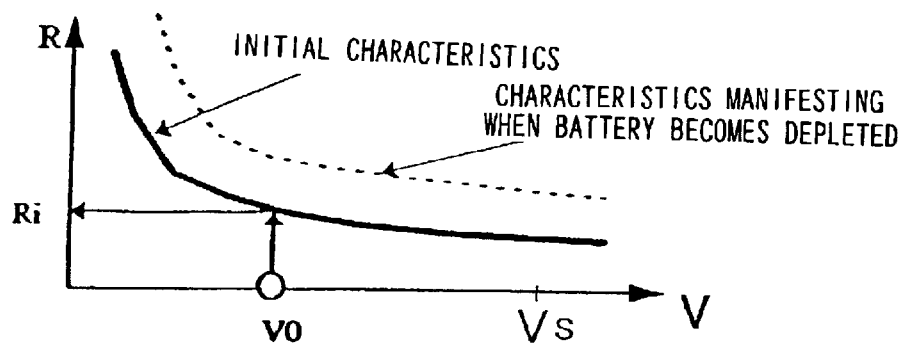
FIG. 6 presents a graph of the current-voltage characteristics of the secondary battery.

Of the curves representing the secondary battery voltage-internal resistance characteristics in FIG. 6, the solid curve represents the state manifesting when the battery is new, i.e., the initial characteristics of the secondary battery, whereas the dotted curve represents a state in which the battery has become depleted. The internal resistance Ri corresponding to the open circuit voltage V0 detected in step S3 is calculated by using the solid curve representing the initial characteristics. In the embodiment, a table of the voltages and corresponding internal resistances is prepared in advance and the internal resistance Ri is calculated using this table. Once the internal resistance Ri is calculated, the operation proceeds to step S5.

In step S5, the temperature of the high-voltage battery 1 is detected by the temperature sensor 4. After the temperature of the high-voltage battery 1 is detected, the operation proceeds to step 6. In step S6, a temperature correction is made on the internal resistance Ri calculated in step S4. Namely, an internal resistance Ri0 having undergone temperature correction is calculated through the formula in expression (1) below by using a temperature coefficient α (%) corresponding to the temperature detected in step S5. The internal resistance Ri0 thus calculated is then stored in memory.

$$Ri0 = Ri \times \alpha / 100 \qquad (1)$$

Once the internal resistance Ri0 having undergone temperature correction is calculated, the operation proceeds to step S7. In step S7, the smoothing capacitor 13 is charged by turning on the charge resistor relay 6 and once the smoothing capacitor 13 becomes charged the charge resistor relay 6 is cut off and the main relays 7A and 7B are turned on, thereby starting to charge the high-voltage battery 0 with a constant current. The value of the constant current used to charge the high-voltage battery 1 at this time is Ichg0. In the following step S8, the current I1 and the current I2 are respectively detected by the current sensor 9 and the current sensor 10. Once the currents I1 and I2 are detected, the operation proceeds to step S9. In step S9, a judgement is made as to whether or not an error has manifested in the current sensors in reference to expression (2) below.

$$|Ichg0 - (I1+I2)| < Ing^* \qquad (2)$$

Since specific auxiliary devices are driven while the high-voltage battery 1 is charged with the constant current Ichg0, the current I2 which actually flows to the DC/DC converter 18, too, is substantially constant. In other words, the relationship as expressed in (3) below is satisfied.

$$Ichg0 = I1 + I2 \qquad (3)$$

Expression (2) is adopted to judge whether or not any error manifests in the current sensor 9, which detects the current I1, and the current sensor 10, which detects the current I2, by using a predetermined error judging threshold value Ing*. If it is judged that the relationship as expressed in (2) is satisfied, the operation proceeds to step S10 in FIG. 3, whereas if it is judged that the relationship is not satisfied, the operation proceeds to step S16. In step S16, it is judged that an error has occurred either in the current sensor 9 or the current sensor 10 before the operation proceeds to step S17. In step S17, a message warning that the high-voltage battery 1 cannot be charged is issued to the driver and the like via the display 20.

Figure 3:
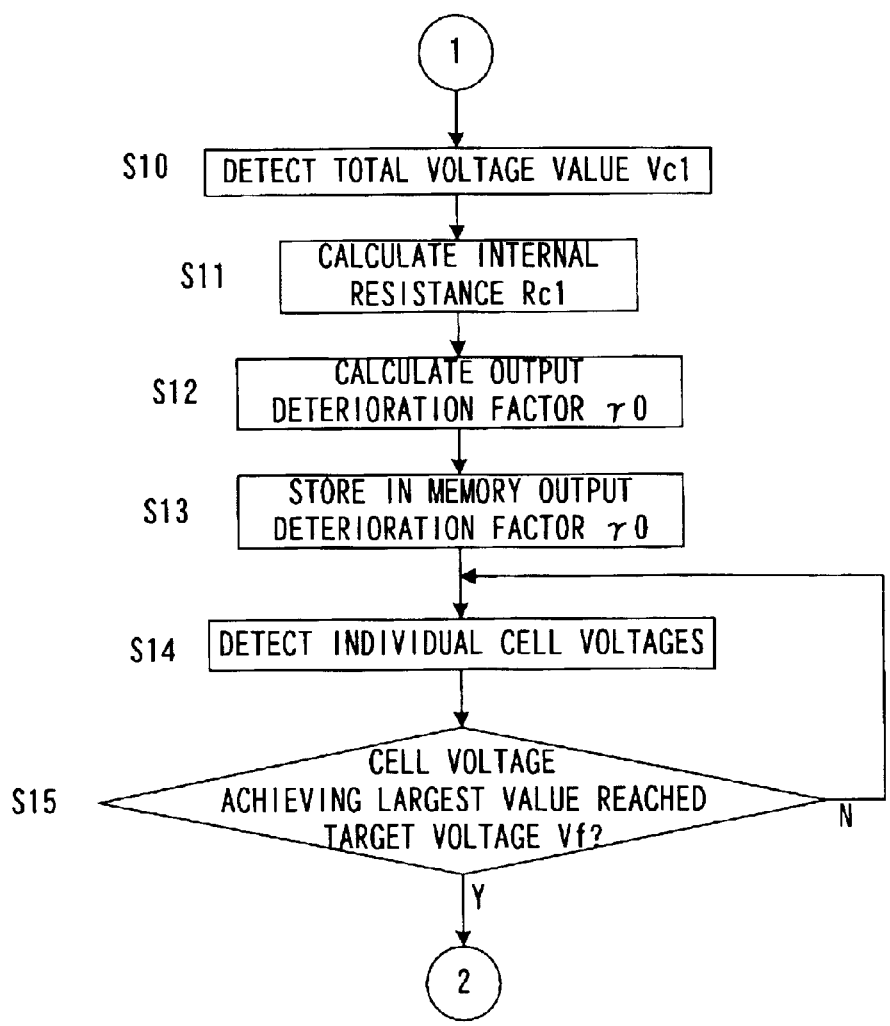
FIG. 3 presents a flowchart of the control procedure, in continuation from the flowchart presented in FIG. 2.

In step S10 in FIG. 3, a total voltage value Vc1 indicating the total sum of the voltages at all the cells constituting the high-voltage battery 1 is detected based upon the voltages at the individual cells detected by the cell controller 2. Once the total voltage value Vc1 is detected, the operation proceeds to step S11. In step S11, an internal resistance Rc1 in the high-voltage battery 1 is calculated through the formula in expression (4) below based upon the total voltage value Vc1 detected in step S10.

$$Rc1 = (Vc1 - V0)/I1 \tag{4}$$

Figure 7:
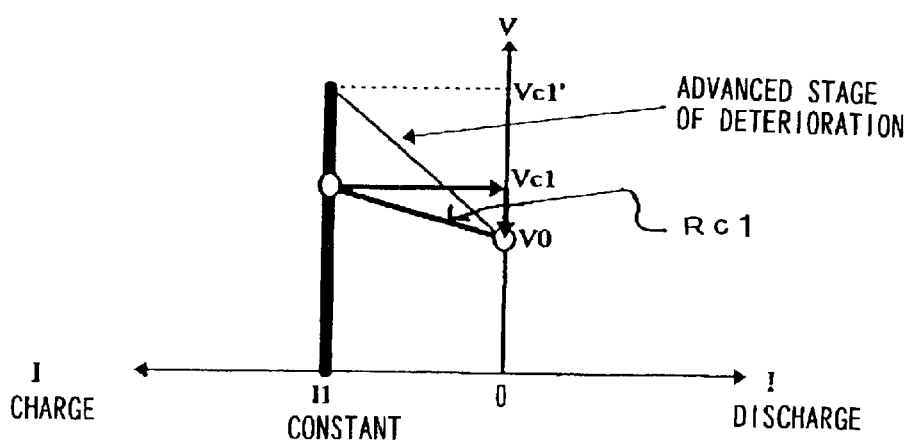
FIG. 7 illustrates a method adopted to calculate the internal resistance manifesting when the charging current is sustained at a constant level.

FIG. 7 presents a graph showing the relationship between the current I flowing to the high-voltage battery 1 and the voltage V. As expression (4) above indicates, the internal resistance Rc1 represents the inclination of the straight line connecting a point (I1, Vc1) and a point (0, V0) in FIG. 7. With Vc1' representing the value of the voltage manifesting when the battery depletion has reached an advanced state, the internal resistance Rc1' manifesting as the output deterioration develops can be calculated through the formula in expression (5) below.

$$Rc1' = (Vc1' - V0)/I1 \tag{5}$$

In this case, too, the internal resistance Rc1' represents the inclination of the straight line connecting a point (I1, Vc1') and a point (0, V0). As FIG. 7 indicates, the internal resistance increases as the battery depletion state advances further.

After calculating the internal resistance Rc1 in step S11, the operation proceeds to step S12. In step S12, an output deterioration factor $\gamma 0$ is calculated by using the internal resistance Ri0 corresponding to the battery initial state which has been calculated in step S6 and the internal resistance Rc1 calculated in step S11. The output deterioration factor $\gamma 0$ (%) indicating the battery output deterioration state may be calculated through the formula in the following expression (6).

$$\gamma 0 = Ri0/Rc1 \times 100 (=Pc/Pint \times 100) \tag{6}$$

In the expression above, Pint represents the discharge-enable output in the battery initial state and Pc represents the discharge-enable output when the battery becomes depleted. The internal resistance Rc1 increases as the state of output deterioration in the secondary battery further advances and thus, the output deterioration factor $\gamma 0$ becomes lower as expression (6) indicates. Once the output deterioration factor $\gamma 0$ is calculated, the operation proceeds to step S13. In step S13, the output deterioration factor $\gamma 0$ calculated in step S12 is stored into a memory (not shown).

In step S14, the voltages at the individual cells are detected. When all the cell voltages are detected, the operation proceeds to step S15. In step S15, a judgement is made as to whether or not the cell voltage indicating the largest value among all the values of the cell voltages detected in step S14 has reached a target voltage Vf. If it is judged that the largest cell voltage value has not reached the target voltage Vf yet, the operation returns to step S14 to continue the charge operation until the largest cell voltage value reaches the target voltage Vf. Once the largest cell voltage value is judged to have reached the target voltage Vf, the operation proceeds to step S18.

Figure 4:
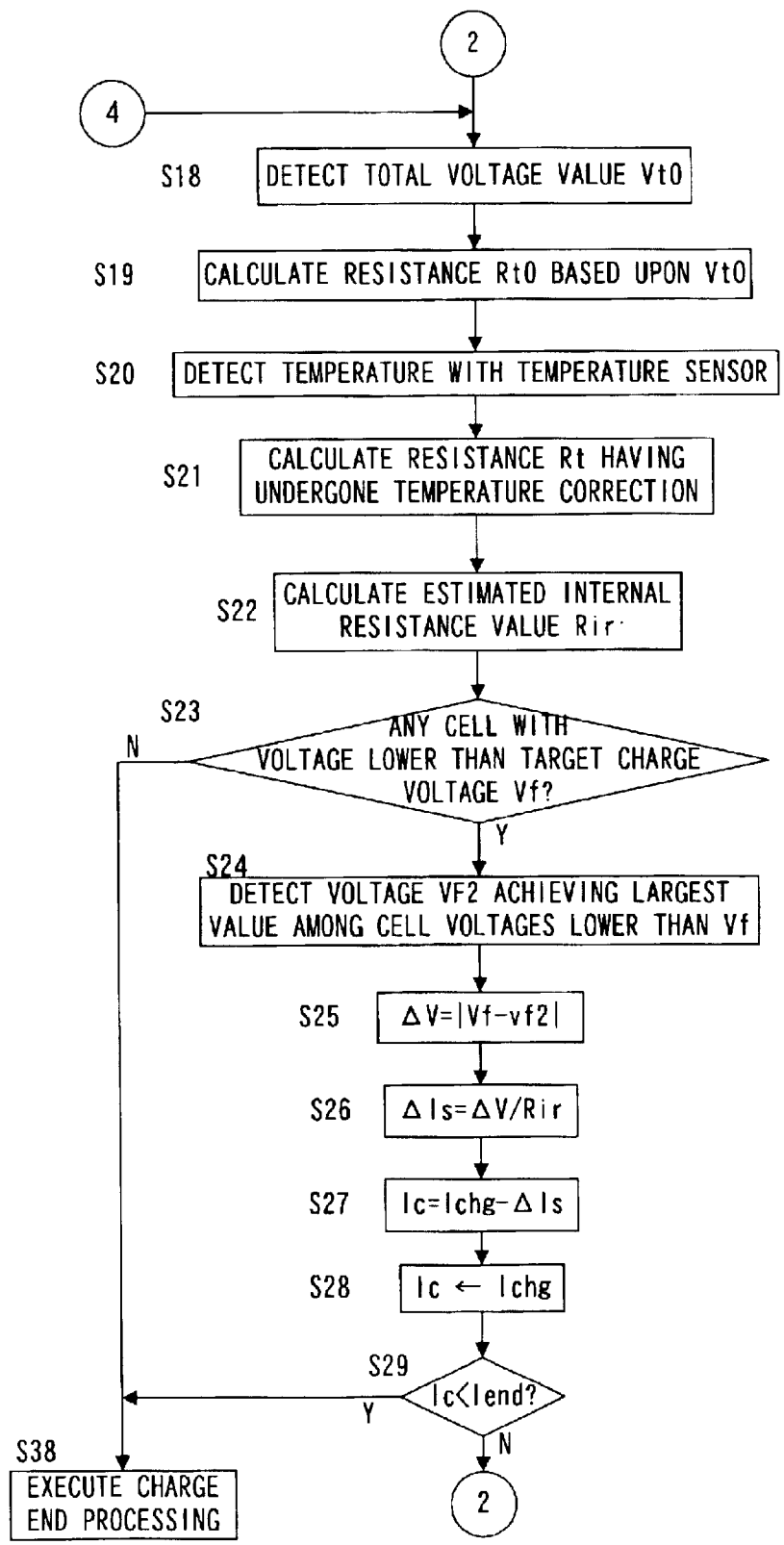
FIG. 4 presents a flowchart of the control procedure, in continuation from the flowchart presented in FIG. 3.

The explanation continues starting in step S18 in the flowchart presented in FIG. 4. In step S18, a total Vt0 of all the cell voltages is detected. After the total voltage value Vt0 is detected, the operation proceeds to step S19. In step S19, an internal resistance Rt0 in the high-voltage battery 1 is calculated based upon the total voltage value Vt0 detected in step S18. As explained earlier, the internal resistance Rt0 is calculated by using the table of the voltage measured while the battery is new and the corresponding internal resistance, which is prepared in advance. Once the internal resistance Rt0 is calculated, the operation proceeds to step S20.

In step S20, the temperature of the high-voltage battery 1 is detected by the temperature sensor 4. After the temperature of the high-voltage battery 1 is detected, the operation proceeds to step S21. In step S21, a temperature correction is made on the internal resistance Rt0 calculated in step S20. Namely, an internal resistance Rt having undergone a temperature correction is calculated through the formula in expression (7) below by using the temperature coefficient a corresponding to the temperature detected in step S20, and the internal resistance Rt thus calculated is then stored in memory.

$$Rt = Rt0 \times \alpha / 100 \tag{7}$$

Once the internal resistance Rt having undergone the temperature correction is calculated, the operation proceeds to step S22. In step S22, an estimated internal resistance value Rir is calculated through the formula in expression (8) below based upon the output deterioration factor $\gamma 0$ calculated in step S12 at the start of the charge operation and the internal resistance Rt calculated in step S21.

$$Rir = Rt/\gamma 0 \times 100 \tag{8}$$

As explained later, any inconsistency among the capacities of the individual cells is corrected through the following control with a high degree of efficiency during a charge operation performed by varying the constant current used in the charge operation. The estimated internal resistance value Rir is used to calculate the extent to which the constant current is to be varied.

In the following step S23, it is judged as to whether or not there is any cell whose voltage is lower than the target charge voltage Vf. If it is judged that there is a cell with a voltage lower than the target charge voltage Vf, the operation proceeds to step S24, whereas if it is judged that there is no cell with a voltage lower than the target charge voltage Vf, the operation proceeds to step S38 to perform charge end processing and thus end the program. In step S24, a voltage Vf2 at the cell achieving the largest voltage value among cell voltages lower than that target charge voltage Vf is detected. Once the voltage Vf2 is detected, the operation proceeds to step S25. In step S25, the difference $\Delta V$ between the target voltage Vf and the voltage Vf2 detected in step S24 is calculated through the formula in expression (9).

$$\Delta V = |Vf - Vf2| \tag{9}$$

In step S26, the extent by which the constant current is to be varied, i.e., $\Delta Is$, is calculated through the formula in expression (10) below based upon Rir calculated in step S22 and $\Delta V$ calculated in step S25.

$$\Delta Is = \Delta V / Rir \tag{10}$$

Once ΔIs is calculated, the operation proceeds to step S27. In step S27, a charging current Ic is calculated through the formula in expression (11).

$$Ic = Ichg - \Delta Is \quad (11)$$

In step S28, the charging current Ic calculated in step S27 is set for Ichg and then the operation proceeds to step S29. In step S29, it is judged as to whether or not the level of the charging current Ic has reached a final charging current value Iend in reference to expression (12).

$$Ic < Iend \quad (12)$$

If it is judged that the level of the charging current Ic has reached the final charging current value Iend and therefore the relationship in expression (12) is satisfied, the operation proceeds to step S38 to end the charge operation. If, on the other hand, it is judged that the relationship in expression (12) is not satisfied yet, the operation proceeds to step S30. The processing in step S30 and subsequent steps is executed to perform a multistage constant current charge operation by varying the charging current. In step S30, a total voltage value Vt1 of the voltages at all the cells and the current It1 flowing through the current sensor 9 are detected.

In step S31, an internal resistance Rc2 is calculated by using the current I1 and the total voltage value Vt0 of the voltages at all the cells obtained before reducing the charging current by ΔIs and the current It1 and the total voltage value Vt1 of the voltages at all the cells obtained after reducing the charging current by ΔIs. This method is now explained in reference to FIG. 8.

Figure 8:
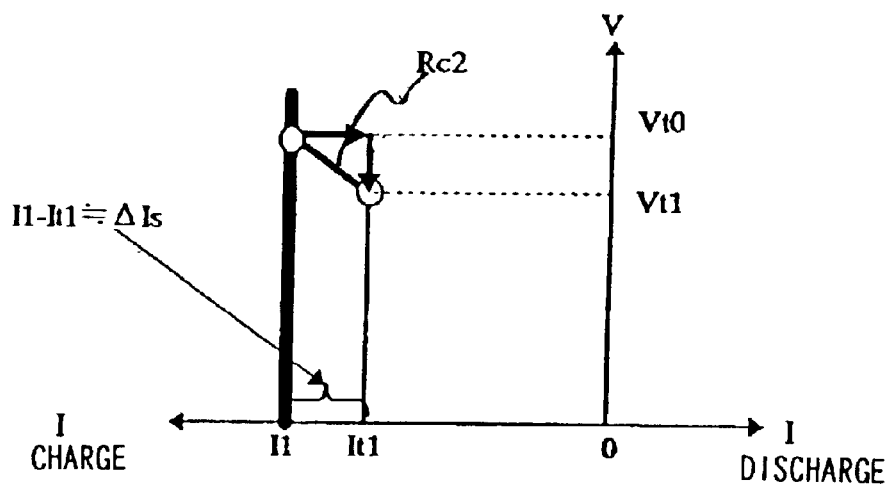
FIG. 8 illustrates a method adopted to calculate the internal resistance manifesting during a multistage constant current charge.

FIG. 8 presents a graph illustrating the relationship between the current I flowing through the high-voltage battery 1 and the voltage V. I1 and Vt0 individually indicates the current value and the voltage value obtained before reducing the charging current by ΔIs, whereas (It1, Vt1) indicates the current-voltage values obtained after the charging current is reduced by ΔIs. The internal resistance Rc2, which represents the inclination of the straight line connecting the point (I1, Vt0) and the point (It1, Vt1), can be determined through the following formula in expression (13).

$$Rc2 = (Vt0 - Vt1)/(I1 - It1) \quad (13)$$

Once the internal resistance Rc2 is calculated, the operation proceeds to step S32. In step S32, an output deterioration factor γ1 is calculated through the formula in expression (14) below by using the internal resistance Rt calculated in step S21 and the internal resistance Rc2 calculated in step S31.

$$\gamma 1 = Rt/Rc2 \times 100 \quad (14)$$

After the output deterioration factor γ1 is calculated, the operation proceeds to step S33. In step S33, the number of times N over which ΔIs is subtracted from the charging current until the charging current reaches the predetermined final charging current value is estimated through the formula in expression (15) below.

$$N = (Ichg0 - Iend)/\Delta Is \quad (15)$$

Figure 9:
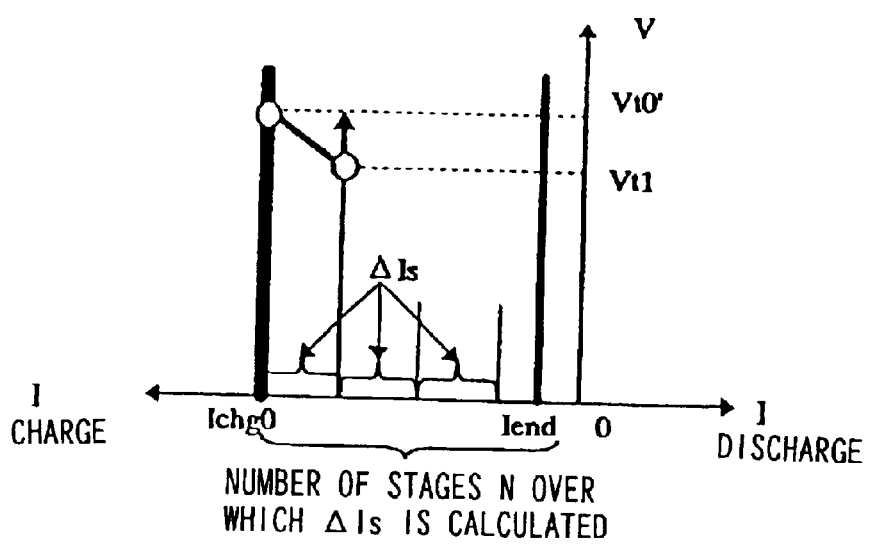
FIG. 9 illustrates a method adopted to calculate an estimated number of stages N.

As shown in FIG. 9, ΔIs calculated in step S26 is repeatedly subtracted from the current Ichg0 at the charge operation start until the level of the charging current reaches the final charging current value Iend stored in memory in advance at the battery controller 3. Since the processing in step S18 through step S37 is repeatedly executed until the charging current reaches the final charging current value, the calculation of ΔIs, too, is performed repeatedly. Accordingly, the number of times N determined through the formula in expression (15), too, is calculated repeatedly. In addition, since ΔIs is not a fixed value but a variable value, the value of N which is calculated based upon ΔIs is not fixed either.

In the following step S34, the output deterioration factor γ0 having been calculated at the charge operation start is corrected by using the output deterioration factor γ1 calculated in step S32 and the number of stages N for the multistage charge operation calculated in step S33. By calculating the number of stages N for the multistage charge operation based upon ΔIs in step S33, the accuracy of the output deterioration factor correction is improved. The output deterioration factor γm having undergone the correction is expressed as in (16) below.

$$\gamma m = \gamma 0 \times (N-1)/N + \gamma 1 \times 1/N \quad (16)$$

Once the output deterioration factor γm having undergone the correction is calculated, the operation proceeds to step S35. In step S35, the corrected output deterioration factor γm calculated in step S34 is stored in memory.

In step S36, the voltages at all the cells are detected and then the operation proceeds to step S37. In step S37, it is judged as to whether or not the voltage at any other cell has reached the target voltage Vf during the charge operation. If it is judged that no other voltage has reached the target voltage Vf, the operation returns to step S36 to continue the charge operation until the voltage at another cell reaches the target voltage Vf. When it is judged that another cell voltage has reached the target voltage Vf, the operation returns to step S18 to repeatedly execute the processing in step S18 and subsequent steps until the charging current reaches the final charging current value.

As described above, through the processing in the flowchart in FIGS. 2~5, the battery output deterioration factor γ can be calculated in the following sequence A~D.

A: The output deterioration factor γ0 for the charge operation performed with the constant current I1 is calculated through processes (1)~(3) below.

(1) The open circuit voltage V0 is detected, the internal resistance Ri is calculated by using the table and the resistance Ri0 before the start of charging is calculated through the temperature correction (expression (1), steps S3~S6).

(2) The internal resistance Rc1 is calculated based upon the open circuit voltage V0 and the total voltage Vc1 at the start of the charge operation with the constant current I1 (expression (4), steps S10 and S11).

(3) The output deterioration factor γ0 for the constant current charge operation performed with the constant current I1 is calculated in correspondence to the resistance Ri0 before the start of charging and the internal resistance Rc1 after the start of charging (expression (6), step S12).

B: Once the voltage at a given cell reaches the target voltage Vf, the degree ΔIs by which the constant current I1 is to be reduced is determined through the following processes (4)~(7).

(4) Once the voltage at a cell has reached the target voltage Vf, the total voltage Vt0 is detected while sustaining the charging current at the constant level I1, the internal resistance Rt0 is calculated by using the table and the internal resistance Rt corresponding to the charging current I1 is calculated through temperature correction (expression (7), steps S14~S21).

(5) The estimated internal resistance value Rir is calculated based upon the internal resistance Rt and the output deterioration factor γ0 corresponding to the constant current I1 (expression (8), step S22).

(6) The largest value Vf2 among the cell voltages lower than the target voltage Vf is detected and the difference ΔV relative to the target value is calculated (expression (9), steps S23~S25).

(7) The degree ΔIs by which the charging current is to be reduced is calculated based upon the estimated internal resistance value Rir and ΔV (expression (10), step S26).

C: The output deterioration factor γ1 for the charge operation performed with a constant current Ic obtained by reducing the constant current Is by ΔIs is calculated through the following processes (8)~(10).

(8) The constant current Ic to be set next is calculated by subtracting ΔIs from the initial constant current Ichg0 (expression (11), step S27).

(9) The total voltage Vt1 and the current It1 are detected during the charge operation performed with the constant current Ic, and the internal resistance Rc2 is calculated using the total voltage Vt0 calculated in B(1) above as well as the detected total voltage Vt1 and current It1 (expression (13), steps S30 and S31).

(10) Based upon the internal resistance Rt corresponding to the constant current value I1 and the internal resistance Rc2 corresponding to the constant current Ic, the output deterioration factor γ1 corresponding to the constant current Ic is calculated (expression (14), step S32).

D: The number of stages N for the multistage charge operation performed with a constant current is calculated, and then the output deterioration factor γm having undergone the correction is calculated based upon N, the output deterioration factor γ0 for the charge operation performed with the constant current Ichg0 and the output deterioration factor γ1 for the charge operation performed with the constant current Ic (expression (16), steps S33~S35).

The processing described above is executed repeatedly until all the cell voltages exceed the target voltage Vf or until the charging current reaches the final current value Iend.

Figure 5:
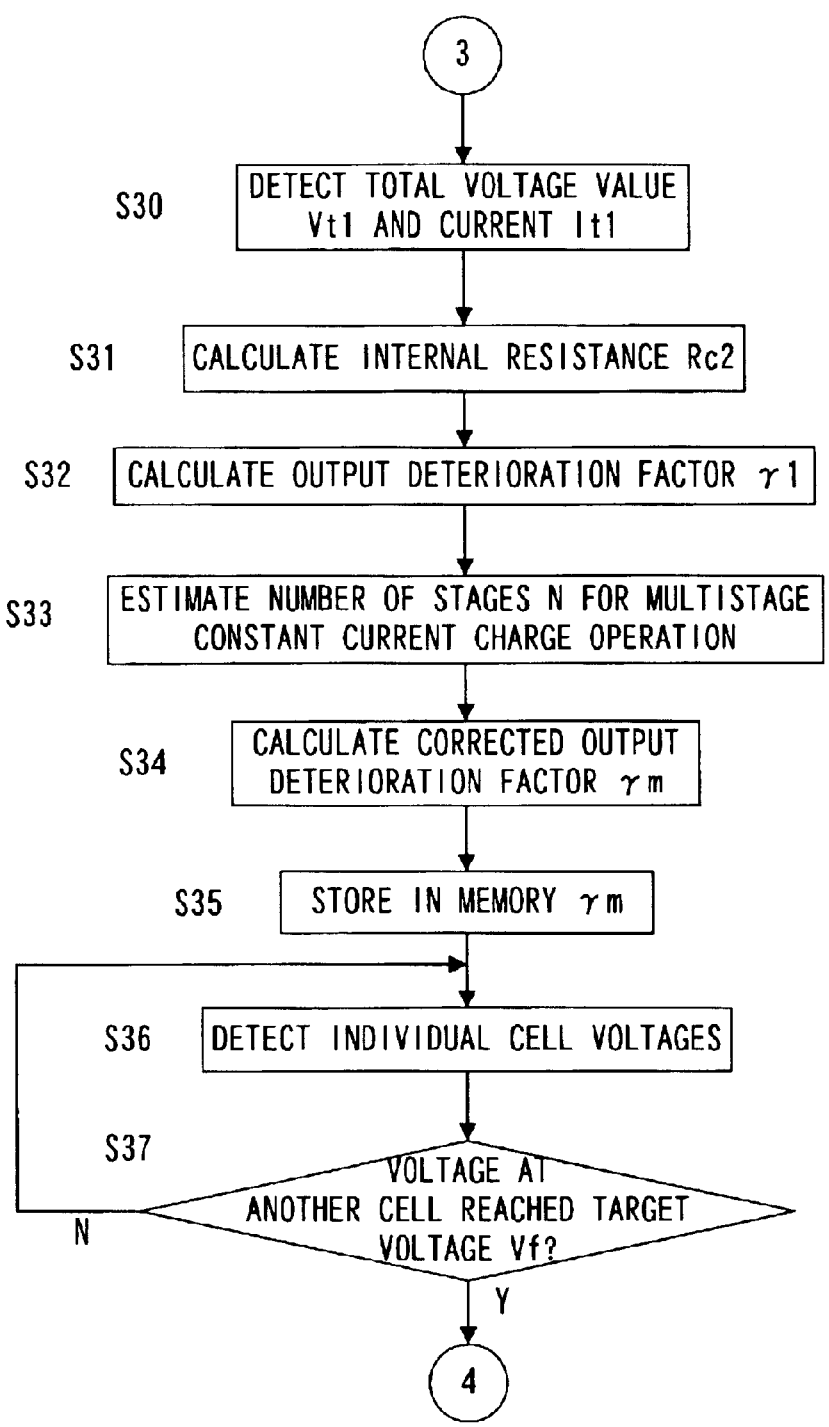
FIG. 5 presents a flowchart of the control procedure, in continuation from the flowchart presented in FIG. 4.

FIG. 10 presents a flowchart of the processing executed to calculate the output deterioration factor when the charge operation stops before shifting to the multistage constant current charge operation starting in step S30 in the flowchart presented in FIG. 5. The following is an explanation of the processing, given in sequence starting with step S51. In step S51, it is judged as to whether or not the charge operation has been stopped before shifting to the multistage constant current charge operation due to, for instance, a disengagement of the charger 15 from the charging port 16, and if an affirmative judgement is made, the operation proceeds to step S52.

In step S52, a total voltage value Vst detected immediately before the charge operation stopped and the corresponding current value Ist detected by the current sensor 9 are read into the battery controller 3. In step S53, it is judged as to whether or not the current value Ist read in step S50 equals 0. If it is judged that the current value Ist is not 0, the operation remains in step S53 in standby until the current value equals 0. When it is judged that the current value Ist is 0, the operation proceeds to step S54.

In step S54, a voltage value total Vs0 of all the cell voltages is detected and then the operation proceeds to step S55. In step S55, an internal resistance Rs in the high-voltage battery 1 is calculated based upon the voltage value total Vs0 detected in step S54. The calculation of the internal resistance Rs is performed by using the voltage-internal resistance characteristics curves in FIG. 6 as explained earlier. Once the internal resistance Rs is calculated, the operation proceeds to step S56. In step S56, the temperature of the high-voltage battery 1 is detected by the temperature sensor before the operation proceeds to step S57. In step S57, a temperature correction is made on the internal resistance Rs calculated in step S56 to obtain through an internal resistance Rs0 having undergone the temperature correction through the formula in expression (17). α in expression (17) represents the temperature coefficient determined based upon the temperature detected in step S56.

$$Rs0 = Rs \times \alpha / 100 \tag{17}$$

In step S58, an internal resistance Rst is calculated through the formula in expression (18) based upon Vst, Ist detected in step S52 and Vs0 detected in step S54.

$$Rst = (Vst - Vs0)/Ist \tag{18}$$

Once the internal resistance Rst is calculated, the operation proceeds to step S59. In step S59, an output deterioration factor γs is calculated through the formula in expression (19).

$$\gamma s = Rso/Rst \times 100 \tag{19}$$

In the following step S60, the output deterioration factor γs calculated in step S59 is stored in memory to replace γ0 having been stored at the charge operation start (step S13 in FIG. 3). In step S61, the operation of the battery controller 3 is stopped and the control procedure ends.

As the voltage-internal resistance characteristics curves presented in FIG. 6 indicate, the relationship expressed in (20) below is ascertained by comparing the extent of change occurring in the internal resistance relative to the voltage V0 at the charge operation start when the voltage level is low (ΔR0/ΔV0) and the extent of change in the internal resistance relative to the voltage Vs manifesting when the charge operation is halted in the middle (ΔRs/ΔVs).

$$(\Delta R0/\Delta V0) > (\Delta Rs/\Delta Vs) \tag{20}$$

Accordingly, the accuracy with which the output deterioration factor γs is calculated when the charge operation is halted is higher than the accuracy with which the output deterioration factor γ0 is calculated at the charge operation start. For this reason, γs is stored in place of the output deterioration factor γ0 in step S60.

In the secondary battery capacity deterioration calculating apparatus achieved in the embodiment, the secondary battery output deterioration factor is calculated based upon the open circuit voltage of the secondary battery and a voltage achieved by charging the battery with a constant current. Thus, since no regression analysis needs to be performed, unlike in the deterioration calculation control in the related art, no calculation error attributable to a regression analysis occurs either. Namely, if the plurality of points at which the voltage value and the current value are sampled are not uniform the regression line obtained through the regression analysis becomes different from the line representing the actual current-voltage characteristics. Since no regression analysis is performed in the secondary battery output deterioration calculation control, the accuracy of the calculation in the embodiment is higher compared to that of the deterioration calculation control in the related art.

A calculation error is bound to occur in the secondary battery output deterioration calculation control in the related art when the vehicle is engaged in a high load operation, i.e., when the vehicle is rapidly accelerating or is running on a steep uphill slope. Such a calculation error is attributed to an error occurring in the regression line obtained by sampling the current value and the voltage value at the plurality of sampling points, which is caused by a significant current discharged from the high-voltage battery 1 when the vehicle is running with a high load. Thus, if the battery output deterioration factor is calculated while the vehicle is running with a high load, the results of the calculation deviate from the state of the actual battery depletion. However, since the internal resistances are calculated in correspondence to the voltage values determined during the constant current charge operation and then the battery deterioration factor is calculated in the secondary battery output deterioration calculation control in the embodiment, a high load operation of the vehicle does not affect the calculation process.

In addition, the output deterioration factor is corrected by estimating the number of stages N representing the number of times the current is to be varied during the multistage constant current charge operation achieved by varying the constant current used for the charge operation. As shown in FIG. 6, the value of the internal resistance in the secondary battery changes by a smaller extent and nears a given constant value as the battery becomes fully charged. In other words, the output deterioration factor which is calculated based upon the ratio to the initial internal resistance value is closest to the accurate value manifesting the least error when the battery is fully charged. By correcting the output deterioration factor through gradual steps when performing a multistage constant current charge operation as in the embodiment, the accuracy with which the output deterioration factor is calculated at the end of the charge operation can be further improved.

Furthermore, if the charge operation is halted before shifting to the multistage constant current charge operation, the output ratio calculated at the charge operation start is replaced with the output ratio calculated after the charge operation is halted so as to enable accurate calculation of the extent of depletion of the secondary battery 1 by using the output ratio corresponding to the charge capacity.

The above described embodiment is an example, and various modifications can be made without departing from the spirit and scope of the invention. For instance, while an explanation is given above in reference to the embodiment on an example in which the secondary battery output deterioration calculating apparatus is adopted in an electric car, the present invention may be adopted in a hybrid electric car, instead. In this case, the battery deterioration factor can be calculated in a similar manner when engaging a dynamo-electric motor to charge the high-voltage battery 1 by detecting whether or not the dynamo-electric motor is engaged in operation. In addition, the present invention may be adopted in conjunction with a system other than a vehicle as long as the system is mounted with a battery capable of being charged/discharged.

The battery pack, which is charged does not need to be constituted by connecting in series four modules each achieved by connecting eight cylindrical cells as in the embodiment. In addition, while a warning is provided on the display 20 to alert the driver that a charge operation cannot be performed in step S17 in the flowchart presented in FIG. 2, such a warning may be provided through an indicator or a buzzer instead.

The disclosure of the following priority application is herein incorporated by reference:

Japanese Patent Application No. 2001-241250 filed Aug. 8, 2001.

What is claimed is:

1. A secondary battery output deterioration calculating method for calculating a battery output deterioration based upon an output ratio of a battery output ascertained as a secondary battery becomes depleted and an initial battery output, comprising:

detecting an open circuit voltage of the second battery;

detecting a voltage while the secondary battery is charged with a constant current; and calculating the output ration of the open circuit voltage of the secondary battery having been detected and the voltage detected while the secondary battery is charged with the constant current.

2. A secondary battery output deterioration calculating apparatus that calculates a battery output deterioration based upon an output ratio of a battery output ascertained as a secondary battery becomes depleted and an initial battery output, wherein:

the output ratio is calculated in correspondence to the open circuit voltage of the secondary battery an a voltage detected while the secondary battery is charged with a constant current.

3. A secondary battery output deterioration calculating apparatus according to claim 2, comprising:

an open circuit voltage detection devices that detects the open circuit voltage of the secondary battery;

a no-load internal resistance detection device that calculates an internal resistance of the secondary battery corresponding to the open circuit voltage detected by the open circuit voltage detection device;

a constant current charged operation voltage detection device that detects the voltage manifesting while the secondary battery is charged with a constant current;

a charge operation internal resistance calculation device that calculates the internal resistance in the secondary battery corresponding to the voltage detected by the constant current charged operation voltage detection device while the secondary battery is charged with the constant current; and an output deterioration calculation device that calculates the output deterioration based upon a ratio of the internal no-load resistance and the internal charge resistance.

4. A secondary battery output deterioration calculating apparatus according to claim 3, further comprising:

a subtraction stage estimating device that estimates a number of stages over which a current is to be reduced during a multistage constant current charge operation performed to charge the secondary battery by sequentially reducing the current until the charge operation is completed; and an output ratio correction device that corrects the output ratio calculated by the output deterioration calculation device based upon the number of subtraction stages estimated by the subtraction stage estimating device.

5. A secondary battery output deterioration calculating apparatus according to claim 4, wherein:

if the charge operation is halted before shifting to the multistage constant current charge operation, the output deterioration calculation device calculates the output ration after the charge operation is halted.

6. A secondary battery output deterioration calculating apparatus according to claim 5, wherein:

the output ratio calculated by the output deterioration calculation device after the charge operation is halted is calculated based upon a current value and a voltage value detected immediately before the charge operation is halted and a voltage value detected after the charge operation is halted.

7. A secondary battery output deterioration calculating apparatus according to claim 3, wherein:

the open circuit voltage detection device includes a temperature detection device which detects the temperature of the secondary battery and a temperature correction device that corrects the open circuit voltage of the secondary battery based upon the temperature of the secondary battery detected by the temperature detection device.

8. A secondary battery output deterioration calculating apparatus that calculates a battery output deterioration based upon an output ratio of a battery output ascertained as a secondary battery becomes depleted and an initial battery output, comprising:

an open circuit voltage detection means for detecting an open circuit voltage of the secondary batter;

a no-load internal resistance detection means for calculating an internal resistance of the secondary battery corresponding to the open circuit voltage detected by the open circuit voltage detection means;

a constant current charge operation voltage detection means for detecting the voltage manifesting while the secondary battery is charged with a constant current;

a charge operation internal resistance detection means for calculating the internal resistance of the secondary battery corresponding to the voltage detected by the constant current charge operation voltage detection means while the secondary battery is charged with the constant current; and an output deterioration calculation means for calculating the output deterioration based upon a ratio of the internal no-load resistance and the internal charge resistance.

* * * * *